Dec. 31, 1963 R. J. NIELSEN ETAL 3,116,171

SATELLITE SOLAR CELL ASSEMBLY

Filed March 14, 1961

INVENTORS
R. J. NIELSEN
L. RONGVED
BY
H W Lockhart
ATTORNEY

United States Patent Office 3,116,171

Patented Dec. 31, 1963

3,116,171
SATELLITE SOLAR CELL ASSEMBLY

Robert J. Nielsen, Mountainville, and Leif Rongved, New Providence, N.J., assignors to Bell Telephone Laboratories, Incorporated, New York, N.Y., a corporation of New York Filed Mar. 14, 1961, Ser. No. 95,707
5 Claims. (Cl. 136—89)

This invention relates to an assembly and mounting arrangement for semiconductor solar cells, particularly for installation on artificial space satellites. In certain aspects the invention has broader application in the arts related to electron device fabrication.

The use of semiconductor pn junction devices as solar energy conversion elements in artificial space satellites requires high efficiency and reliability. It is apparent that solar batteries employed on orbiting space vehicles are subjected to a range of environmental conditions far beyond those encountered in more conventional applications. In particular, effects resulting from exposure to temperatures ranging from about −100 degrees centigrade to about +70 degrees centigrade render difficult the secure mechanical and electrical connection of such cells. Moreover, the desirably high level of incident solar radiation on the energy conversion apparatus produces considerable buildup of local internal heat which advantageously must be reradiated to prevent additional thermal stresses. In addition, higher levels of particle bombardment have an adverse effect on many materials particularly organics used as adhesives.

Accordingly, an object of this invention is an improved solar cell assembly for a space satellite.

More particularly, an object is to provide a mounting and enclosing apparatus for solar cells having improved resistance to thermal stresses. In particular, an object of this invention is a mounting means for semi-conductor solar cells which enables good electrical connection and at the same time provides flexible joints where a differential thermal movement would result in excessive thermal stress on the assembly. Another object of the invention is the provision of good thermally conductive paths for dissipating heat collected within the solar cell enclosure.

In accordance with a specific embodiment of this invention a plurality of pn junction solar cells are soldered together in a shingled arrangement to provide a series-connected array on a ceramic mounting plate. The shingled array of cells, in addition to being soldered successively to one another, are joined to the ceramic mounting plate through intermediate silver and aluminum expansion joints. A transparent cover assembly consists of a plurality of sapphire plates brazed by means of an active metal alloy in a single heat treatment to a platinum side frame. The cover assembly is affixed to the ceramic mounting plate by a soldered joint which is continuous around the periphery of the plate. Thus, there is established a good thermal path from the cells and mounting plate, through the platinum side members to the highly conductive sapphire plates for reradiation. In particular, this structural arrangement limits the "greenhouse effect" in which incident radiation generates heat which is trapped within an enclosure by lack of good heat conducting paths to radiant surfaces. This cell assembly or battery then is secured to the satellite shell by conventional metallic tabs and electrically connected to adjoining assemblies.

Thus a feature of the solar cell assembly described is the good heat conducting path provided from the base or mounting plate to the radiating cover member. Another feature resides in the metal expansion joint provided for mounting each individual cell so as to permit differential movement of the semiconductor wafers relative to the mounting plate.

Another feature is the brazed joint between the sapphire cover plates and the platinum side plates.

These and other objects and features of the invention will be more clearly understood from the following description taken in connection with the drawing in which.

Figure 1:
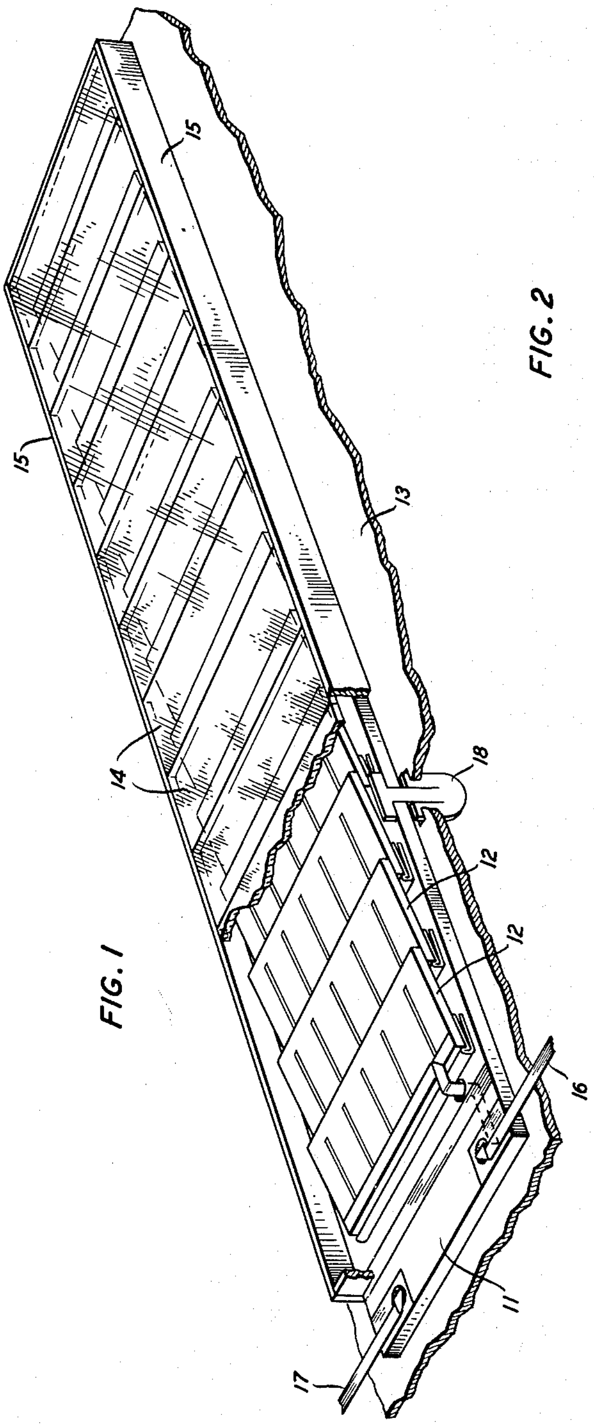
FIG. 1 is a perspective view partly broken away showing an array of semiconductor wafers in an assembly in accordance with this invention, mounted on the satellite outer shell.

Referring to FIG. 1, the base plate 11 for the assembly is a ceramic such as alumina ($Al_2O_3$) in polycrystalline form which has the requisite physical strength for this application. Assembled in an overlapping or shingled relation are the pn junction semiconductor wafers 12 which constitute the energy converting devices or solar cells. Each of the wafers contains a laterally disposed pn junction, with the surface of one thin conductivity type layer toward the light.

The array of wafers is enclosed by a cover and side frame comprising a series of sapphire strips 14 brazed to platinum side plates 15. This assembly is joined to the ceramic base plate 11 by a continuous soft solder bond. Electrical connections to the assembly are provided by ribbonlike terminal leads 16 and 17. The entire solar cell assembly is mounted on the satellite shell 13, which typically, may be a metal plate or honeycomb, by means of beryllium-copper tabs 18 secured through mounting slots in the mounting plate and the satellite shell. Interposed between the mounting plate and the satellite shell are additional layers of mica and epoxy for insulation and support.

Figure 2:
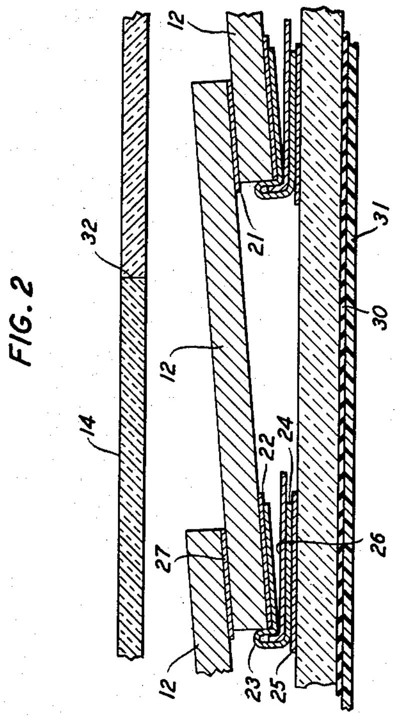
FIG. 2 is a sectional side view taken through a portion of the assembly.

Some particular features of this novel assembly are more readily apparent in FIG. 2 which shows a portion of the assembly in side elevation and in section. The semiconductor wafer 12 is shown connected by a soft solder bond 21 to the next adjoining wafer. This bond of a lead, tin and antimony alloy, provides both electrical connection and solid physical connection to the adjoining wafer. At the other end the wafer is secured by a similar bond 22 to a folded silver foil member 23 which has a loop portion providing a flexible joint. The reverse fold 24 is bonded to a metallized portion 25 of the ceramic base plate 11. A sheet of aluminum 26 is interposed between the upper and lower portions of the silver sheet to prevent a flow of solder from the upper portion to the lower portion which might result in the direct bond of the wafer to the base plate.

The upper surface 27 of the lower end of this wafer in turn is bonded to the lower surface of the adjacent wafer as previously described. Thus the array of semiconductor wafers is securely bonded one to another for electrical connection, and the entire array is securely but flexibly bonded to the mounting plate 11 but at the same time the entire array of wafers may move differentially with respect to the mounting plate. This arrangement is desirable because of the difference in the coefficient of expansion of the silicon wafers and the alumina base plate. For example, the thermal coefficient of silicon varies from $2.5 \times 10^{-6}$ inches per inch per degree centigrade at 20 degrees centigrade to $0.9 \times 10^{-6}$ inches per inch per degree centigrade at −87 degrees centigrade. The polycrystalline alumina has a coefficient of about $6 \times 10^{-6}$ inches per inch per degree centigrade in the same temperature range. The expansion joint described typically comprises a 2 mil thick folded silver sheet with a 1 mil thick sheet of aluminum forming a barrier between the two portions of the silver sheet.

FIG. 2 also shows the transparent sapphire or single crystal alumina cover members 14 as well as the mica layer 30 and epoxy layer 31 under the mounting plate 11. It should be noted that the sapphire cover strips have polished side edges 32 where they are adjacent to one another. This arrangement causes incident light striking this interface to be reflected onto the solar cell surface, rather than being refracted or diffused so as not to reach the cell surfaces.

Another significant aspect of the invention is the excellent heat conduction path provided from the alumina base plate 11 through the platinum side plates 15 to the single crystal alumina or sapphire cover plates 14. The series of cover plates 14 must be used of necessity because of the present difficulty in producing a complete single crystal sheet of this size. These sapphire cover plates are .030 inch thick to provide adequate protection for the solar cells both from electron bombardment and from micrometeoroids. A further particular advantage of the sapphire cover plates is their resistance to discoloration under electron bombardment. Each sapphire strip is about 0.400 x 0.850 inch making the entire assembly about 0.850 x 4.50 inches.

Figure 3:
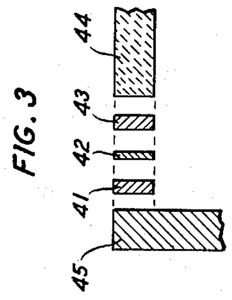
FIG. 3 is an exploded view of the elements of the brazed joint between the transparent cover members and the metallic side plate.

Advantageously, the metal side plates are joined to the sapphire cover plates by a bond which is stable throughout the environment to which the satellite is exposed. In particular, most organic adhesives have been found to deteriorate under the conditions experienced in orbital space flight and in accordance with this invention the sapphire cover plates are bonded to the inner metal, in this case platinum side plates, using an active metal alloy. This brazed connection is made as shown in FIG. 3 by using a pair of 1 mil (0.001 inch) thick silver preforms 41 and 43 with an 0.8 mil thick zirconium preform 42 between the silver layers. This sandwiched structure is clamped between the sapphire cover plate 44 and the platinum side plate 45 and the entire assembly is heated to a temperature in the range of 960 to 970 degrees centigrade in a dry nitrogen atmosphere. No preparation other than to insure the cleanliness of the various parts is made. After brief heating, in this temperature range the assembly is cooled and a mechanically strong bond is formed having a desirable fillet on the inner face of the joint. Typically, for a one-shot heat treatment, a complete assembly is held at the elevated temperature for about ten minutes. Thus a particularly advantageous bond is produced by a single-step process eliminating the necessity of premetallizing any of the parts being joined.

As previously described, this entire cover assembly comprising thirteen sapphire cover plates with the platinum side and end frame is soldered using a lead-tin-antimony to the ceramic base plate 11. In this particular arrangement of twelve individual wafers or cells which are connected in series, the entire assembly is further connected to six other similar assemblies making a total of eighty-four individual cells connected in series on the surface of the satellite shell. At normal incidence to the sun and with a 9 percent efficient cell, such an array provides about 2 watts output at approximately 34 volts. Thus there has been described a specific solar cell assembly with high resistance to the particular conditions encountered in space flight and particularly to the relatively large and rapid temperature changes undergone by a satellite in orbit around the earth.

What is claimed is:

1. In a solar cell assembly for mounting on an artificial space satellite, means for mounting an array of semiconductor solar cells connected in overlapping relation including flexible means for enabling differential thermal movement of said array and said mounting means, said mounting means comprising a ceramic base plate, said flexible means comprising a folded metal foil for each cell of said array, said foil having one fold bonded to said cell and the other fold bonded to said base plate, and protective means for enclosing said cells, said means being transparent to solar radiation and having good thermal conductivity.

2. In a solar cell assembly for mounting on an artificial space satellite, means for mounting an array of semiconductor solar cells connected in overlapping bonded relation including flexible means for enabling differential thermal movement of said array and said mounting means, said mounting means comprising a thermally conductive ceramic base plate, said flexible means comprising a folded metal foil for each cell of said array, said foil having one fold bonded to said cell and the other fold bonded to said base plate and a flexible loop portion joining said folds, said flexible means including a barrier member interleaving said folds, and protective means for enclosing said cells, said means being transparent to solar radiation and having good thermal conductivity.

3. In a solar cell assembly for mounting on an artificial space satellite, means for mounting an array of semiconductor solar cells connected in overlapping relation including flexible means for enabling differential thermal movement of said array and said mounting means, said mounting means comprising a ceramic base plate, said flexible means comprising a folded metal foil for each cell of said array, said foil having one fold bonded to said cell and the other fold bonded to said base plate, protective means for covering said cells, said means being transparent to solar radiation and having relatively high thermal conductivity, and inert metal side plates bonded to said covering means and to said ceramic base plate.

4. In a solar cell assembly for mounting on an artificial space satellite, means for mounting an array of semiconductor solar cells connected in overlapping relation including flexible means for enabling differential thermal movement of said array and said mounting means, said mounting means comprising a ceramic base plate, said flexible means comprising a folded metal foil for each cell of said array, said foil having one fold bonded to said cell and the other fold bonded to said base plate, protective means for covering said array, said means comprising a plurality of single crystal alumina plates, and insert metal side plates brazed to said cover plates and to said base plate.

5. In a solar cell assembly for mounting on an artificial space satellite, means for mounting an array of semiconductor solar cells connected in overlapping bonded relation including flexible means for enabling differential thermal movement of said array and said mounting means, said mounting means comprising an alumina base plate, said flexible means comprising a folded silver foil for each cell of said array, said foil having one fold bonded to said cell and the other fold bonded to said base plate, and a flexible loop portion joining said folds, an aluminum barrier member interleaving said folds for preventing direct bonding from said cell to said base plate, protective means for covering said array, said means being transparent to solar radiation and having relatively high thermal conductivity, and platinum side plates bonded to said covering means and to said ceramic base plate.

References Cited in the file of this patent

UNITED STATES PATENTS

| | | |
|---|---|---|
| 2,428,537 | Veszi et al. | Oct. 7, 1947 |
| 2,779,811 | Picciano et al. | Jan. 29, 1957 |
| 2,800,710 | Dunn | July 30, 1957 |
| 2,823,245 | Solow | Feb. 11, 1958 |
| 2,859,512 | Dijksterhuis et al. | Nov. 11, 1958 |
| 2,938,938 | Dickson | May 31, 1960 |
| 2,946,945 | Regnier et al. | July 26, 1960 |
| 2,989,575 | Wallace | June 20, 1961 |